(12) United States Patent
Park et al.

(10) Patent No.: US 8,598,577 B2
(45) Date of Patent: Dec. 3, 2013

(54) DISPLAY SUBSTRATE AND METHOD OF MANUFACTURING THE SAME

(75) Inventors: Jae-Woo Park, Seongnam-si (KR); Dong-Hoon Lee, Seoul (KR); Sung-Haeng Cho, Cheongwon-gun (KR); Woo-Geun Lee, Yongin-si (KR); Hye-Young Ryu, Seoul (KR); Young-Joo Choi, Yongin-si (KR)

(73) Assignee: Samsung Display Co., Ltd. (KR)

( * ) Notice: Subject to any disclaimer, the term of this patent is extended or adjusted under 35 U.S.C. 154(b) by 20 days.

(21) Appl. No.: 13/177,783

(22) Filed: Jul. 7, 2011

(65) Prior Publication Data

US 2012/0018720 A1   Jan. 26, 2012

(30) Foreign Application Priority Data

Jul. 23, 2010   (KR) ................... 10-2010-0071391

(51) Int. Cl.
*H01L 29/786* (2006.01)

(52) U.S. Cl.
USPC .......................................... 257/43

(58) Field of Classification Search
USPC ............................................ 257/43, E29.079
See application file for complete search history.

(56) References Cited

U.S. PATENT DOCUMENTS

| 8,158,976 | B2 * | 4/2012 | Son et al. ................. 257/43 |
| 2010/0035379 | A1 * | 2/2010 | Miyairi et al. ............ 438/104 |
| 2010/0117075 | A1 * | 5/2010 | Akimoto et al. ........... 257/43 |
| 2010/0117078 | A1 * | 5/2010 | Kuwabara et al. ......... 257/43 |

* cited by examiner

*Primary Examiner* — Tran Tran
(74) *Attorney, Agent, or Firm* — Cantor Colburn LLP (57) ABSTRACT

A display substrate includes a gate line extending in a first direction on a base substrate, a data line on the base substrate and extending in a second direction crossing the first direction, a gate insulating layer on the gate line, a thin-film transistor and a pixel electrode. The thin-film transistor includes a gate electrode electrically connected the gate line, an oxide semiconductor pattern, and source and drain electrodes on the oxide semiconductor pattern and spaced apart from each other. The oxide semiconductor pattern includes a first semiconductor pattern including indium oxide and a second semiconductor pattern including indium-free oxide. The pixel electrode is electrically connected the drain electrode.

11 Claims, 5 Drawing Sheets

DISPLAY SUBSTRATE AND METHOD OF MANUFACTURING THE SAME

This application claims priority to Korean Patent Application No. 2010-0071391, filed on Jul. 23, 2010, and all the benefits accruing therefrom under 35 U.S.C. §119, the contents of which are herein incorporated by reference in their entirety.

BACKGROUND OF THE INVENTION

1. Field of the Invention

The invention relates to a display substrate and a method for manufacturing the display substrate. More particularly, the invention relates to a display substrate including an oxide semiconductor thin-film transistor ("TFT") and a method for manufacturing the display substrate.

2. Description of the Related Art

Generally, a display device includes an array substrate including a switching element, and a counter substrate opposite to the array substrate. The switching element includes a gate electrode connected to a gate line, a semiconductor pattern insulated from the gate electrode, a source electrode connected to a date line and electrically connected to the semiconductor pattern, and a drain electrode spaced apart from the source electrode.

A TFT used as the switching element of the display device includes an amorphous-silicon TFT ("amorphous-Si TFT"), a poly-silicon TFT ("poly-Si TFT"), an oxide semiconductor TFT and so on.

The amorphous-Si TFT may be uniformly formed on a large substrate at a low cost, but a mobility of an electric charge is low. The poly-Si TFT has a higher mobility of an electric charge than the amorphous-Si TFT, and a deterioration of a characteristic of the poly-Si TFT is small, but a manufacturing process of the poly-Si TFT is complicated so that a cost for manufacturing is high.

The oxide semiconductor TFT may use a low temperature process, have a higher mobility of an electric charge and be easy to form a large area. However, an oxide semiconductor may react with a source electrode or a drain electrode which includes a metal. Thus, a positive ion included in the oxide semiconductor is deoxidized and extracted to cause a defect.

When the positive ion included in the oxide semiconductor is deoxidized and extracted, a composition of a channel layer of the TFT is changed so that the mobility of the electric charge may be decreased. In addition, a resistance of a wiring may be increased by a metal extracted from the oxide semiconductor. Thus, electrical safety and reliability of the switching element may be decreased.

BRIEF SUMMARY OF THE INVENTION

Exemplary embodiments of the invention provide a display substrate enhancing an electrical characteristic of an oxide semiconductor thin film transistor ("TFT").

Exemplary embodiments of the invention also provide a method of manufacturing the display substrate.

According to an exemplary embodiment of the invention, a display substrate includes a gate line extending along a first direction on a base substrate, a data line extending along a second direction crossing the first direction, a gate insulating layer on the gate line, a thin-film transistor and a pixel electrode. The thin-film transistor includes a gate electrode electrically connected to the gate line, an oxide semiconductor pattern including a first semiconductor pattern including indium oxide and a second semiconductor pattern including indium-free oxide, and a source electrode and a drain electrode on the oxide semiconductor pattern and spaced apart from each other. The pixel electrode is electrically connected to the drain electrode.

In an exemplary embodiment, the indium-free oxide may include one of zinc oxide, tin oxide and gallium zinc oxide. The zinc oxide may include at least one selected from the group consisting of boron (B), aluminum (Al), thallium (Tl), tin (Sn), hafnium (Hf), fluorine (F), chlorine (Cl), bromine (Br), iodine (I), astatine (At) and a combination thereof. The tin oxide may include at least one selected from the group consisting of antimony (Sb), fluorine (F) and a combination thereof.

In an exemplary embodiment, a carrier concentration of the indium-free oxide may be between about $10^{17}$ per cubed centimeter ($/cm^3$) and about $10^{21}$ per cubed centimeter ($/cm^3$).

In an exemplary embodiment, the gate insulating layer may include first and second insulating layers. The first insulating layer may be on the base substrate and on the gate electrode, and include silicon nitride. The second insulating layer may be on the first insulating layer, and include silicon oxide.

In an exemplary embodiment, the source electrode and the drain electrode may include titanium (Ti).

In an exemplary embodiment, the source and drain electrodes may include a first metal layer including titanium (Ti), a second metal layer including copper (Cu) and on the first metal layer, and a third metal layer including copper (Cu)-manganese (Mn) alloy or copper (Cu)-manganese (Mn)-Aluminum (Al) alloy or copper (Cu)-manganese (Mn)-Aluminum (Al) alloy on the second metal layer and on the second metal layer.

In an exemplary embodiment, the second semiconductor pattern of the display substrate may include a first pattern, and second pattern spaced apart from the first pattern. The display substrate may further include an insulating pattern between the first and second patterns of the second semiconductor pattern, and electrically insulating the first and second patterns from each other.

In an exemplary embodiment, the display substrate may include a passivation layer including silicon oxide, and on the base substrate, the source electrode and the drain electrode.

According to another exemplary embodiment of the invention, a method for manufacturing a display substrate includes forming a gate pattern including a gate line and a gate electrode, on a base substrate. A gate insulating layer, a first semiconductor layer including indium oxide, a second semiconductor layer including indium-free oxide and a source metal layer are formed sequentially on the gate pattern which is on the base substrate. A photoresist pattern is formed on the source metal layer which is on the base substrate. The source metal layer, the first semiconductor layer and the second semiconductor layer are patterned using the photoresist pattern as an etch stopping layer, to form a source pattern and an oxide semiconductor pattern. The source pattern includes a source electrode and a drain electrode, and the oxide semiconductor pattern includes first and second semiconductor patterns. The second semiconductor pattern is formed between the first semiconductor pattern and the source pattern. A pixel electrode is formed on the source pattern and the oxide semiconductor pattern, which are on the base substrate. The pixel electrode is electrically connected to the drain electrode.

In an exemplary embodiment, the indium-free oxide may include one of zinc oxide, tin oxide and gallium zinc oxide. The zinc oxide may include at least one selected from the group consisting of boron (B), aluminum (Al), thallium (Tl), tin (Sn), hafnium (Hf), fluorine (F), chlorine (Cl), bromine (Br), iodine (I), astatine (At) and a combination thereof. The tin oxide may include at least one selected from the group consisting of antimony (Sb), fluorine (F) and a combination thereof.

In an exemplary embodiment, a carrier concentration of the indium-free oxide may be between about $10^{17}/cm^3$ and about $10^{21}/cm^3$.

In an exemplary embodiment, the photoresist pattern may be formed by forming a photoresist layer on the source metal layer and patterning the photoresist layer, to form the photoresist pattern including a first photoresist sub-pattern and a second photoresist sub-pattern. The first photoresist sub-pattern has a first thickness, and is formed in an area where the source pattern is formed. The second photoresist sub-pattern has a second thickness smaller than the first thickness, and is formed in an area between the source electrode and the drain electrode.

In an exemplary embodiment, the source pattern and the oxide semiconductor pattern may be formed by etching the source metal layer, the second semiconductor layer and the first semiconductor layer using the photoresist pattern as an etch stopping layer, removing the second photoresist sub-pattern, removing a portion of the source metal layer exposed by the second photoresist sub-pattern to form the source electrode and the drain electrode, and forming the first and second semiconductor patterns using the source and drain electrodes.

In an exemplary embodiment, the first and second semiconductor patterns may be formed by partially removing the second semiconductor layer exposed by the source and drain electrodes, to form the second semiconductor pattern including a first pattern and a second pattern. The first and second patterns of the second semiconductor layer may be spaced apart from each other on the first semiconductor pattern.

In an exemplary embodiment, the first and second semiconductor patterns may be formed by forming a first pattern and a second pattern being spaced apart from each other on the first semiconductor pattern, and forming an insulating pattern between the first and second patterns of the second semiconductor pattern. The insulating pattern electrically insulates the first and second patterns of the second semiconductor layer exposed by the source and drain electrodes from each other.

In an exemplary embodiment, the gate insulating layer may include a first insulating layer formed on the gate electrode, and including silicon nitride and a second insulating layer formed on the first insulating layer and including silicon oxide In an exemplary embodiment, the source and drain electrodes may include titanium (Ti).

In an exemplary embodiment, the source metal layer may include a first metal layer including titanium (Ti), a second metal layer including copper (Cu) and a third metal layer including copper (Cu)-manganese (Mn) alloy or copper (Cu)-manganese (Mn)-Aluminum (Al) alloy or copper (Cu)-manganese (Mn)-Aluminum (Al) alloy on the second metal layer.

In an exemplary embodiment, the method may include forming a passivation layer including silicon oxide on the source and drain electrodes, which are formed on the base substrate.

According to exemplary embodiments of a display substrate and a method for manufacturing the display substrate, since an oxide semiconductor pattern is a double layer structure, deoxidization and extraction as a metal of an ion of the oxide semiconductor within the oxide semiconductor pattern may be reduced or effectively prevented. Thus, an electrical characteristic of the oxide semiconductor TFT may be enhanced.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION OF THE INVENTION

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, the element or layer can be directly on or connected another element or layer, or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be explained in detail with reference to the accompanying drawings.

Figure 1:
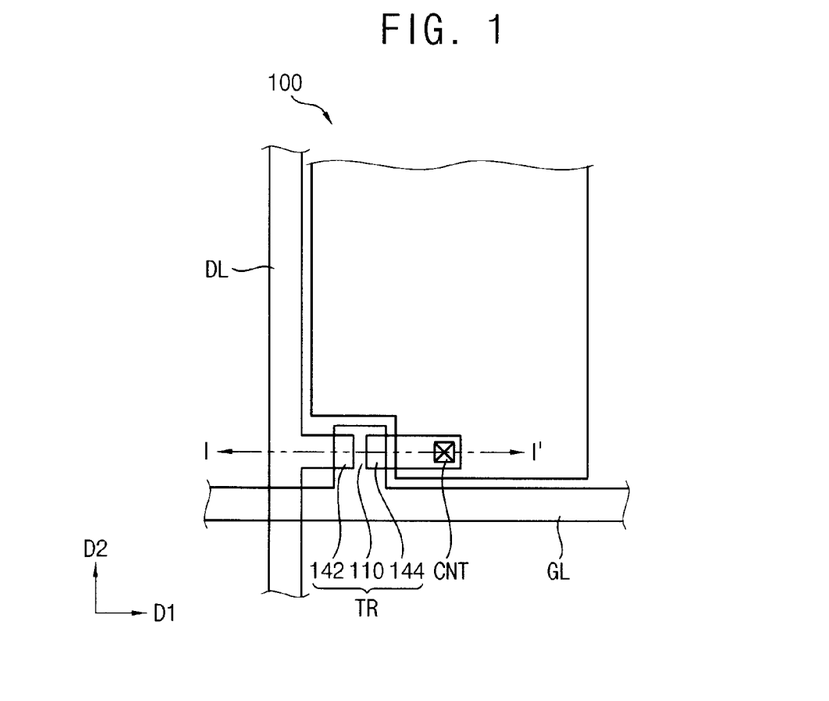
FIG. 1 is a plan view illustrating an exemplary embodiment of a display substrate, according to an the invention.
Figure 2:
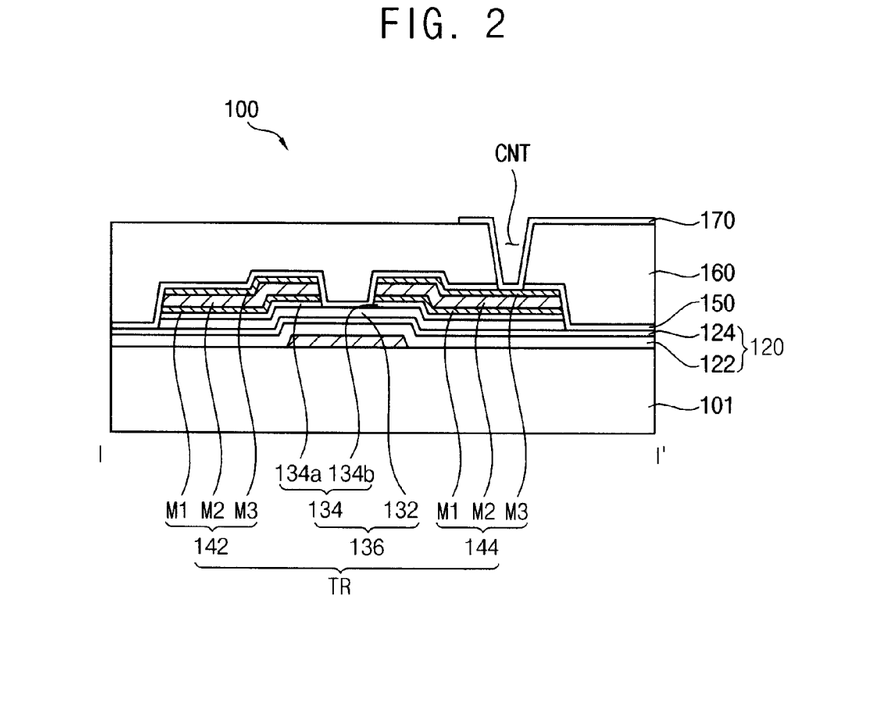
FIG. 2 is a cross-sectional view taken along line I-I' of FIG. 1.

FIG. 1 is a plan view illustrating an exemplary embodiment of a display substrate, according to the invention. FIG. 2 is a cross-sectional view taken along line I-I' of FIG. 1.

Referring to FIGS. 1 and 2, a display substrate 100 according to the illustrated exemplary embodiment includes a base substrate 101, a gate line GL, a data line DL, a gate insulating layer 120, a thin-film transistor TR, a passivation layer 150, an organic layer 160 and a pixel electrode 170. In an exemplary embodiment, the display substrate 100 may include a plurality of the gate line GL, the data line DL, the thin film transistor TR and/or the pixel electrode 170.

The gate line GL extends along a first direction D1. The data line DL extends along a second direction D2 crossing the first direction D1.

The gate line GL includes a gate electrode 110. The gate insulating layer 120 directly covers (e.g., overlaps) the gate line GL and the gate electrode 110 of the thin-film transistor TR. In an exemplary embodiment, the gate insulating layer 120 may overlap an entire of an upper surface of the base substrate 101.

The gate insulating layer 120 may be a double layer structure including a first gate insulating layer 122 and a second insulating layer 124. The first gate insulating layer 122 may include silicon nitride ("SiNx"). The second gate insulating layer 124 may include silicon oxide ("SiOx"). Alternatively, the gate insulating layer 120 may be a single layer structure. When the gate insulating layer 120 is the single layer structure, the gate insulating layer 120 may include silicon oxide ("SiOx").

The thin-film transistor TR may be disposed adjacent to an area where the gate line GL and the data line DL cross each other. The thin-film transistor TR includes the gate electrode 110, an oxide semiconductor pattern 136, a source electrode 142 and a drain electrode 144.

The gate electrode 110 is physically and/or electrically connected to the gate line GL. The gate electrode 110 is continuous with the gate line GL, such that the gate line GL including the gate electrode 110 is a single unitary indivisible element. The gate electrode 110 may be a double layer structure including a first metal layer and a second metal layer. In one exemplary embodiment, the first metal layer includes titanium (Ti), and the second metal layer includes copper (Cu).

The oxide semiconductor pattern 136 includes a first semiconductor pattern 132 and a second semiconductor pattern 134.

The first semiconductor pattern 132 is on the base substrate 101, and contacting a portion of the second gate insulating layer 124 on the base substrate 101. The first semiconductor pattern 132 may include an oxide semiconductor including indium (In). A material that may be used for the oxide semiconductor including indium (In) may include, but is not limited to, indium zinc oxide (InZnO), indium tin oxide (InSnO) and so on.

A material that may be used for the indium zinc oxide (InZnO) may include, but is not limited to, boron (B), aluminum (Al), thallium (Tl), tin (Sn), hafnium (Hf), fluorine (F), chlorine (Cl), bromine (Br), iodine (I), astatine (At), and so on. The materials mentioned above may be used alone or in combination thereof. A material that may be used for the indium tin oxide (InSnO) may include, but is not limited to, antimony (Sb), fluorine (F) and so on.

The second semiconductor pattern 134 may be directly on and contacting a portion of the first semiconductor pattern 132. The second semiconductor pattern 134 may include a first pattern 134a and a second pattern 134b. The first and second patterns 134a and 134b are spaced apart from each other on the first semiconductor pattern 132, with respect to the gate electrode 110.

The second semiconductor pattern 134 may include indium-free oxide. A material that may be used for the indium-free oxide may include, but is not limited to, zinc oxide (ZnO), tin oxide (SnO), gallium zinc oxide (GaZnO) and so on. A material that may be used for the zinc oxide (ZnO) may include boron (B), aluminum (Al), thallium (Tl), tin (Sn), hafnium (Hf), fluorine (F), chlorine (Cl), bromine (Br), iodine (I), astatine (At) and so on. The materials mentioned above may be used alone or in combination thereof. A material that may be used for the tin oxide (SnO) may include antimony (Sb), fluorine (F) and so on. The materials mentioned above may be used alone or in combination thereof.

The second semiconductor pattern 134 functions as a protection layer. In one exemplary embodiment, for example, the second semiconductor pattern 134 reduces or effectively prevents oxidizing of a metal included in the source and drain electrodes 142 and 144, and reduces or effectively prevents deoxidizing of an ion included in the first semiconductor pattern 132. Thus, the second semiconductor pattern 134 finally reduces or effectively prevents extraction of indium included in the first semiconductor pattern 132. The source and drain electrodes 142 and 144 include titanium (Ti), and thus the second semiconductor pattern 134 should not include indium (In).

When the source and drain electrodes 142 and 144 include titanium (Ti) and an oxide semiconductor of the second semiconductor pattern 134 includes indium (In), the titanium (Ti) may be oxidized, and an indium ion included in the oxide semiconductor of the second semiconductor pattern 134 may be deoxidized, so that indium (In) may be extracted. This is the reason why a free energy for forming an oxide of the titanium (Ti) is much lager than that of the indium (In). Here, the free energy for forming the oxide being larger, means that a tendency to be oxidized is larger, for example, considering indium (In) has a greater tendency to be an oxide when reacting with oxygen, than titanium (Ti).

When the indium (In) included in the oxide semiconductor is deoxidized and extracted, a composition of a channel layer of the thin-film transistor TR may be changed so that a mobility of an electric charge is decreased, and a threshold voltage is varied according to a time. In addition, a resistivity of the source and drain electrodes 142 and 144 may be increased by a metal extracted from the oxide semiconductor. Thus, an electrical characteristic of the thin-film transistor TR is decreased. Therefore, the second semiconductor pattern 134 should not include indium (In).

In addition, the second semiconductor pattern 134 functions as an ohmic contact layer decreasing a contact resistance between the first semiconductor pattern 132, and the source and drain electrodes 142 and 144, respectively. To function as the ohmic contact layer decreasing the contact resistance, the second semiconductor pattern 134 includes an indium-free oxide semiconductor, and a carrier concentration of the indium-free oxide semiconductor is not less than about $10^{17}$ per cubed centimeter (/cm$^3$). In one exemplary embodiment, for example, the carrier concentration of the indium-free oxide semiconductor may be between about $10^{17}$/cm$^3$ and about $10^{21}$/cm$^3$.

The carrier concentration may be not less than about $10^{17}$/cm$^3$ by adjusting the elements and the contents of the elements added to the indium-free oxide semiconductor. In one exemplary embodiment, for example, when the second semiconductor pattern 134 includes gallium-zinc oxide (GaZnO) and a total weight of a compound including the gallium and the zinc is 100 wt %, a content of the gallium is set to be between 0 wt % and about 20 wt %.

The source electrode 142 is electrically connected to the data line DL. The source electrode 142 is disposed on (e.g., overlapping) the first pattern 134a of the second semiconductor pattern 134. The source electrode 142 may overlap an entire of the first pattern 134a in the first direction D1.

The drain electrode 144 is disposed on (e.g., overlapping) the second pattern 134b of the second semiconductor pattern 134, and is spaced apart from the source electrode 142 relative to the gate electrode 110. The drain electrode 144 may overlap an entire of the second pattern 134b in the first direction D1. An area of separation between the source electrode 142 and the drain electrode 144 is defined as a channel portion of the thin-film transistor TR.

The data line DL, the source electrode 142 and/or the drain electrode 144 may be a triple layer structure including a first metal layer M1 including titanium (Ti), a second metal layer M2 directly on the first metal layer M1 and including copper (Cu), and a third metal layer M3 directly on the second metal layer M2 and including copper (Cu)-manganese (Mn) alloy or copper (Cu)-manganese (Mn)-Aluminum (Al) alloy. The first metal layer M1 prevents the copper (Cu) included in the second metal layer M2 from spreading into the oxide semiconductor pattern 136, to increase a resistivity of a wiring. The third metal layer M3 protects the second metal layer M2. In one exemplary embodiment, for example, the third metal layer M3 reduces or effectively prevents reaction of the copper (Cu) included in the second metal layer M2 with oxygen included in the passivation layer 150 to be oxidized. In addition, the third metal layer M3 increases a coherence between the passivation layer 150 which is disposed directly on the source and drain electrodes 142 and 144, and the second metal layer M2.

Alternatively, the data line DL, the source electrode 142 and the drain electrode 144 may be a single layer structure including titanium (Ti) alloy.

The passivation layer 150 is on the base substrate 101 including the source and drain electrodes 142 and 144 thereon. The passivation layer 150 may include silicon oxide (SiOx).

The organic layer 160 is directly on and contacting the passivation layer 150. The organic layer 160 planarizes the display substrate 100. The passivation layer 150 and the organic layer 160 include a contact hole CNT extended completely through a thickness thereof and exposing the drain electrode 144. The thickness is taken in a third direction orthogonal to both the first and second directions D1 and D2.

The pixel electrode 170 is on the base substrate 101 including the organic layer 160 thereon. The pixel electrode 170 may be physically and/or electrically connected to the drain electrode 144 of the thin-film transistor TR through the contact hole CNT extending through both the passivation layer 150 and the organic layer 160. The pixel electrode 170 may include a transparent conductive material. In one exemplary embodiment, for example, the pixel electrode 170 may include indium tin oxide ("ITO") or indium zinc oxide ("IZO").

FIGS. 3A to 3G are cross-sectional views explaining an exemplary embodiment of a method of manufacturing the display substrate of FIG. 2.

Figure 3A:
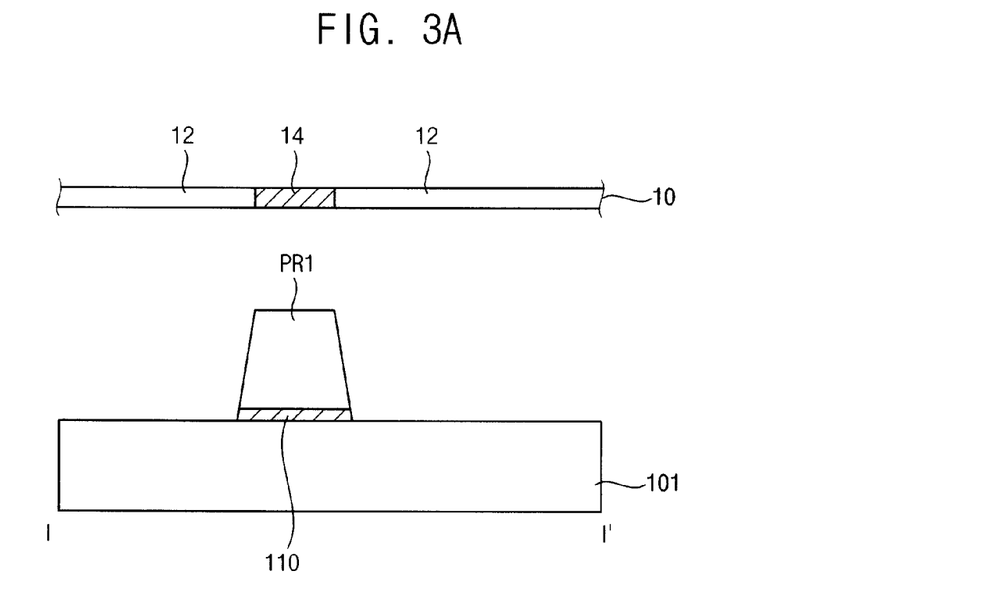
FIGS. 3A to 3G are cross-sectional views explaining an exemplary embodiment of a method of manufacturing the display substrate of FIG. 2.

Referring FIG. 3A, a gate metal layer is formed on the base substrate 101. The gate metal layer may be formed as a single layer structure or a double layer structure. In one exemplary embodiment, for example, the gate metal layer may be formed as a double layer structure including a first metal layer including titanium or titanium alloy, and a second metal layer including copper (Cu). The gate metal layer may be formed using a sputtering method.

A first photoresist pattern PR1 is formed on the base substrate 101 on which the gate metal layer is formed. The first photoresist pattern PR1 is disposed on an area where the gate electrode 110 is formed. After forming a first photoresist layer including a photo-sensitive material on the base substrate 101 on which the gate metal layer is formed, the first photoresist layer is exposed using a first mask 10, and is developed to form the first photoresist pattern PR1. The first mask 10 includes a transmissive portion 12 transmitting light, and a blocking portion 14 blocking the light. A first portion of the first photoresist layer corresponding to the transmissive portion 12, is removed by a developer. A second portion of the first photoresist layer corresponding to the blocking portion 14, remains on the gate metal layer. As used herein, "corresponding" indicates related substantially in dimension, profile and/or position relative to another element.

The gate metal layer is patterned using the first photoresist pattern PR1 as an etch stopping layer to form a gate pattern including the gate electrode 110.

Figure 3B:
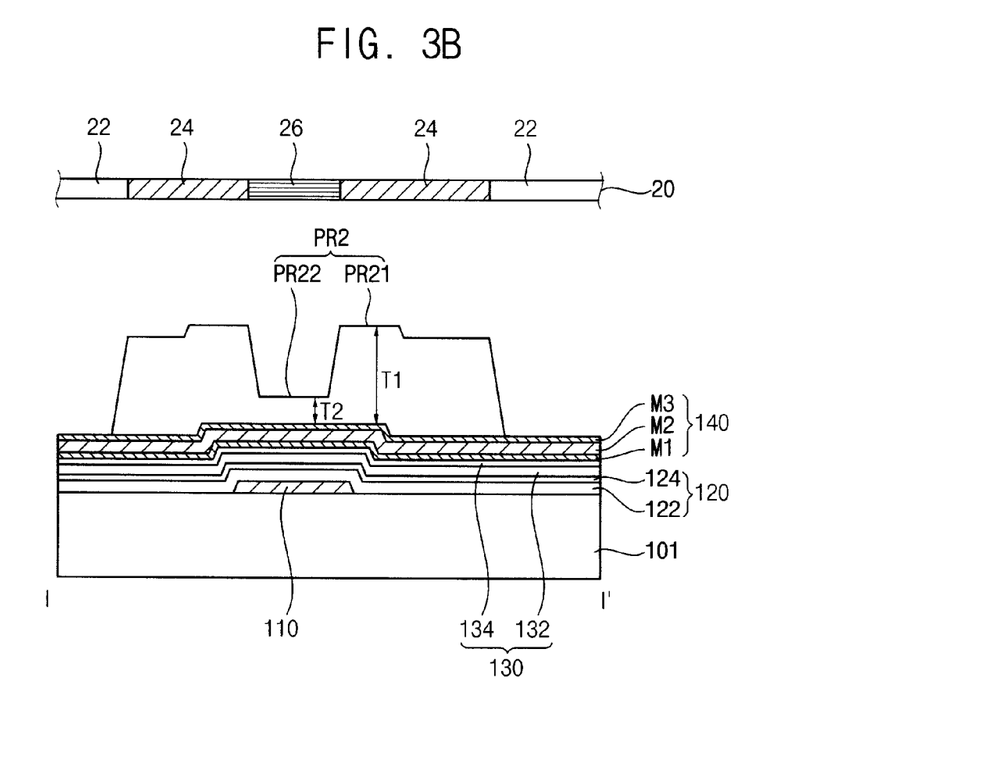

Referring FIG. 3B, a gate insulating layer 120, a first semiconductor layer 132, a second semiconductor layer 134 and a source metal layer 140 are sequentially formed on the base substrate 10,1 on which the gate pattern is previously formed.

The gate insulating layer 120 may include a first gate insulating layer 122 including silicon nitrides ("SiNx"), and a second gate insulating layer 124 including silicon oxides ("SiOx"). A thickness of the first gate insulating layer 122 may be about 4,000 angstroms (Å), and a thickness of the second gate insulating layer 124 may be about 500 Å. The thicknesses are taken in the third direction, e.g., perpendicular to the base substrate 101.

In an exemplary embodiment, the first and second gate insulating layers 122 and 124 may be formed via a chemical vapor deposition ("CVD") method. The second gate insulating layer 124 prevents an oxide semiconductor included in the first semiconductor layer 132 from being reacted with the silicon nitrides ("SiNx") included in the first gate insulating layer 122, so that a composition of the oxide semiconductor of the first semiconductor layer 132 may not be changed.

The first semiconductor layer 132 may include an oxide semiconductor including indium (In). A material that may be used for the oxide semiconductor of the first semiconductor layer 132 including indium (In) may include, but is not limited to, indium zinc oxide (InZnO), indium tin oxide (InSnO) and so on.

The second semiconductor layer 134 may include indium-free oxide. A material that may be used for the indium-free oxide may include zinc oxide (ZnO), tin oxide (SnO), gallium zinc oxide (GaZnO) and so on.

The source metal layer 140 may include a first metal layer M1 including titanium (Ti), a second metal layer M2 directly on the first metal layer M1 and including copper (Cu), and a third metal layer M3 directly on the second metal layer M2 and including copper (Cu)-manganese (Mn) alloy or copper (Cu)-manganese (Mn)-Aluminum (Al) alloy. A thickness of the first semiconductor layer 132 may be between about 200 Å and about 2,000 Å, and a thickness of the second gate insulating layer 124 may be between about 30 Å and about 500 Å. The first and second semiconductor layers 132 and 134 may be formed via a sputtering method.

A second photoresist pattern PR2 is formed on the base substrate 101, including the source metal layer 140 formed thereon. After forming a second photoresist layer on the base substrate 101 on which the source metal layer 140 is formed, the second photoresist layer is exposed using a second mask 20 and is developed to form the second photoresist pattern PR2. The second mask 20 includes a transmissive portion 22 transmitting light, a blocking portion 24 blocking the light and a transflective portion 26 partially transmitting the light.

A first portion of the second photoresist layer corresponding to the blocking portion 24 is not removed by a developer, and remains on the source metal layer 140 with a first thickness T1. The first thickness T1 may be substantially the same as an initial thickness of the second photoresist layer. A second portion of the second photoresist layer corresponding to the transflective portion 26 is partially removed by the developer, and the second portion of the second photoresist layer corresponding to the transflective portion 26 partially remains. Thus, the second portion of the second photoresist layer corresponding to the transflective portion 26 remains with a second thickness T2. The second thickness T2 is smaller than the first thickness T1. A third portion of the second photoresist layer corresponding to the transmissive portion 22 is completely removed by a developer. Thus, the second photoresist pattern PR2 including a first photoresist sub-pattern PR21 having the first thickness T1, and a second photoresist sub-pattern PR22 having the second thickness T2 is formed on the source metal layer 140.

Figure 3C:
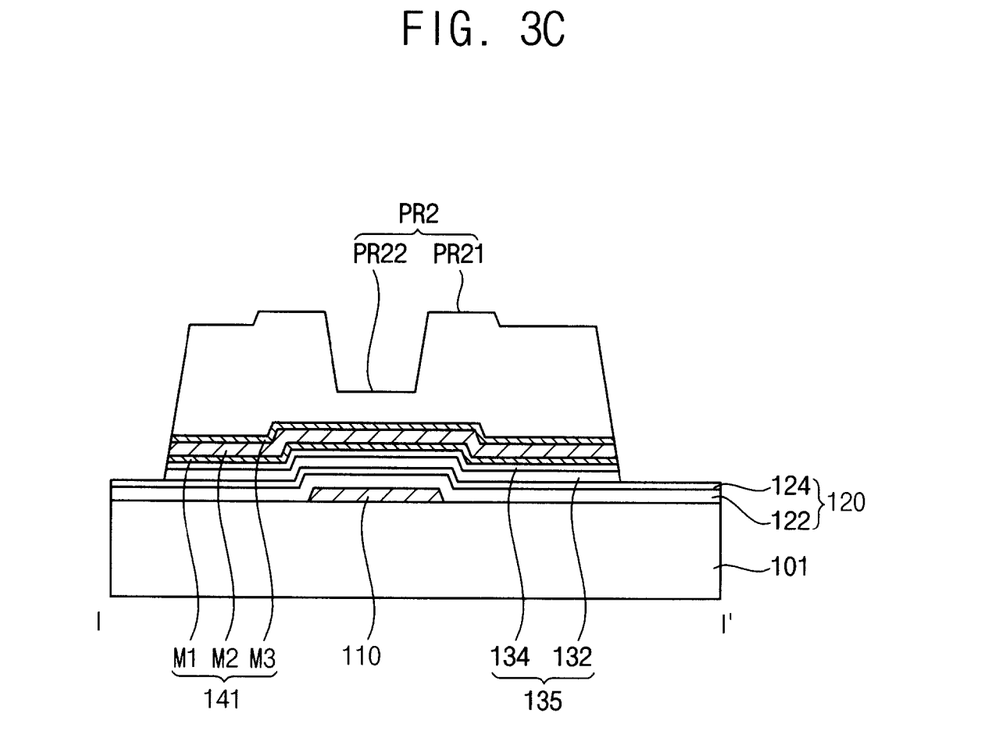

Referring FIG. 3C, the source metal layer 140, the first semiconductor layer 132 and the second semiconductor layer 134 are etched using the second photoresist pattern PR2 as an etch stopping layer. The source metal layer 140, the first semiconductor layer 132 and the second semiconductor layer 134 may be etched at a same time using an integrated etching solution. The integrated etching solution may include tetrachloroethane ("TCE"). Thus, a preliminary electrode pattern 141 and a preliminary semiconductor pattern 135 are formed on the base substrate 101.

Figure 3D:
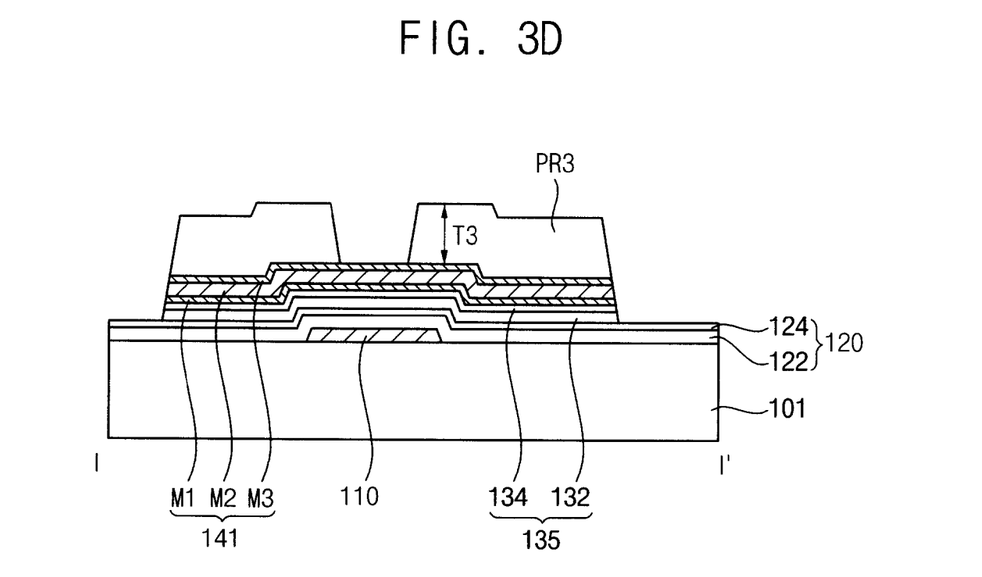

Referring FIG. 3D, the second photoresist sub-pattern PR22 of the second photoresist pattern PR2 is completely removed to form a remaining pattern PR3. The second photoresist pattern PR2 is removed as much as the second thickness T2 to remove the second photoresist sub-pattern PR22, and thus a portion of the first photoresist sub-pattern PR21 is the remaining pattern PR3 having a third thickness T3. The third thickness T3 may be substantially equal to a difference between the second thickness T2 and the first thickness T1. Accordingly, the second photoresist sub-pattern PR22 is removed, and thus the preliminary electrode pattern 141 is partially exposed at an area overlapping the gate electrode 110.

Figure 3E:
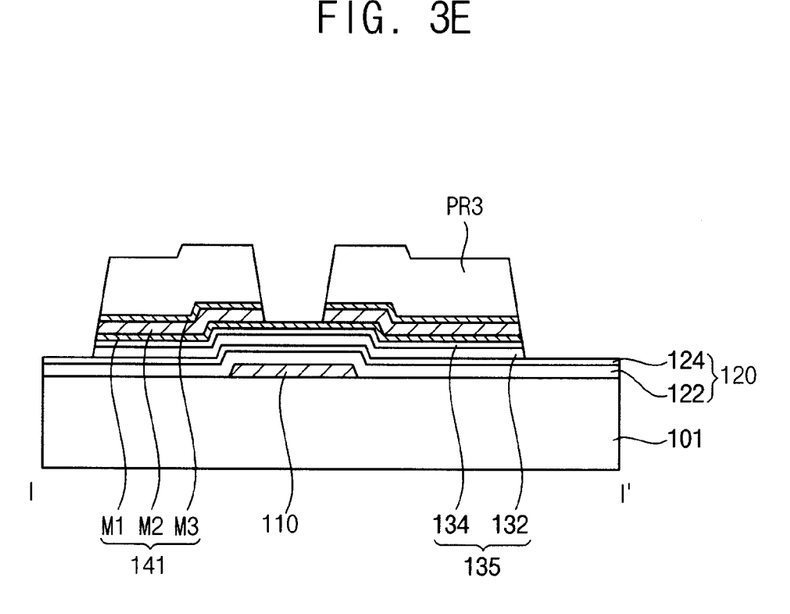

Referring FIG. 3E, the second and third metal layers M2 and M3 of the preliminary electrode pattern 141 are partially removed using the remaining pattern PR3 as an etch stopping layer. The second and third metal layers M2 and M3 may be etched via a wet etching process. The second and third metal layers M2 and M3 are partially removed, and thus the first metal layer M1 is partially exposed.

Figure 3F:
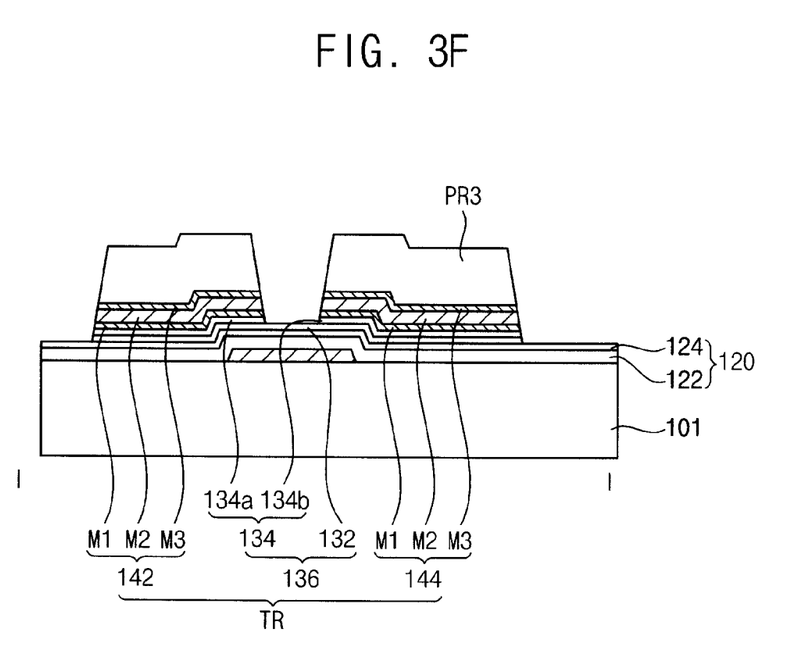

Referring FIG. 3F, the first metal layer M1 of the preliminary electrode pattern 141 that is exposed by partially removing the second and third metal layers M2 and M3, is removed. The first metal layer M1 may be etched via a dry etching process. Accordingly, a second semiconductor pattern 134 of the preliminary semiconductor pattern 135 is exposed.

Then, the second semiconductor pattern 134 of the preliminary semiconductor pattern 135 is partially removed. The second semiconductor pattern 134 may be etched via a wet etching process or a dry etching process. In one exemplary embodiment, for example, when the second semiconductor pattern 134 is etched via the dry etching process, fluorine based gases such as F2, SF6, CF4, C2F4, C3F6, C4F8, etc., chlorine based gases such as C12, HC1, CC14, BCl3, etc., carbon compounds such as CH4, and oxygen gas may be used as an etching gas. Accordingly, a final source electrode 142, a final drain electrode 144 spaced apart from the source electrode 142 and a final oxide semiconductor pattern 136 including a final first semiconductor pattern 132 and a final second semiconductor pattern 134, are formed on the base substrate 101.

Figure 3G:
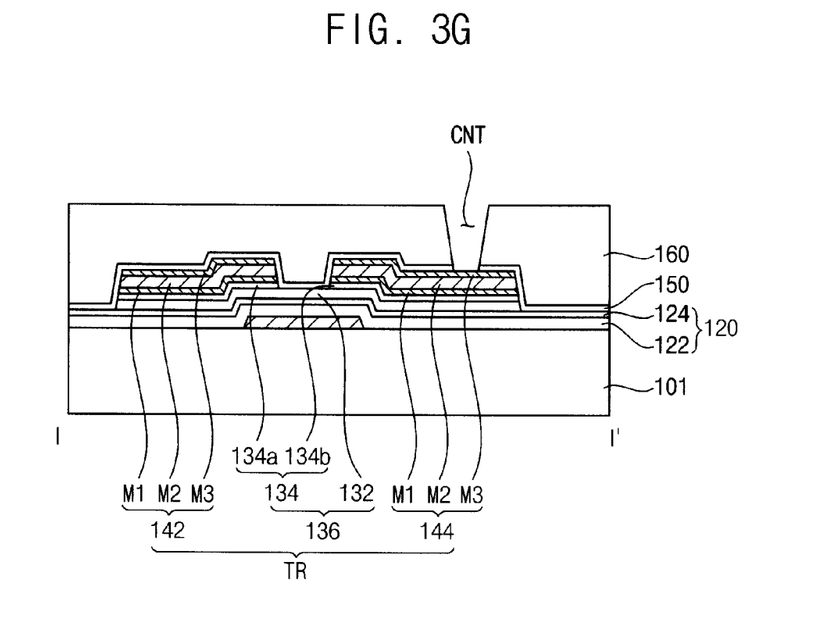

Referring FIG. 3G, the remaining pattern PR3 is removed using a stripper. Accordingly, the thin-film transistor TR including the gate electrode 110, the oxide semiconductor pattern 136, the source electrode 142 and the drain electrode 144 is formed.

Then, after forming the passivation layer 150 on the base substrate 101 on which the thin-film transistor TR is formed, the passivation layer 150 is annealed. The passivation layer 150 is annealed at a temperature of about 200 Celsius (° C.) to about 400° C. with oxygen or nitrogen during a time of about 10 minutes to about 2 hours.

An organic layer 160 is formed on the base substrate 101 on which the passivation layer 150 is formed. The passivation layer 150 may include silicon oxide ("SiOx"). The passivation layer 150 may reduce or effectively prevent indium oxide included in the first semiconductor pattern 132, which is exposed by the separated area between the source electrode 142 and the drain electrode 144, from being deoxidized and extracted as indium.

The organic layer 160 and the passivation layer 150 are patterned to form a contact hole CNT exposing the drain electrode 144. Then, a transparent electrode layer is formed on the base substrate 101 on which the contact hole CNT is formed, and the transparent electrode layer is patterned to form a pixel electrode 170. The pixel electrode 170 is physically and electrically connected to the drain electrode 144 through the contact hole CNT. Accordingly, the display substrate 100 according to illustrated exemplary embodiment of FIG. 2 is manufactured.

According to the illustrated exemplary embodiments, the oxide semiconductor pattern 136 is a double layer structure, to reduce or effectively prevent a metal included in the source and drain electrodes 142 and 144 from being reacted with an oxide semiconductor within the first semiconductor pattern 132 of the oxide semiconductor pattern 136, and being oxidized. Thus, deoxidizing and extracting of an ion included in the oxide semiconductor is reduced or effectively prevented.

Figure 4:
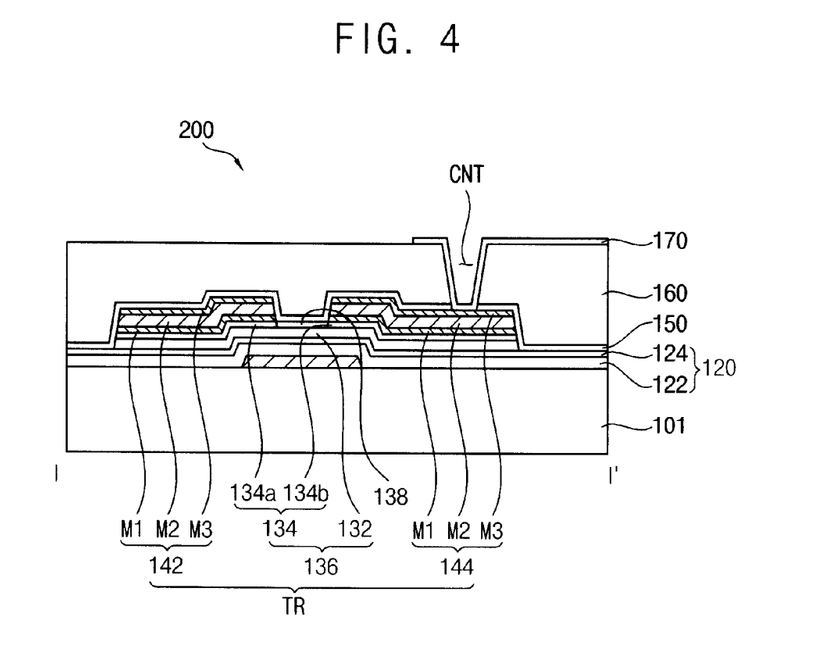
FIG. 4 is a plan view illustrating another exemplary embodiment of a display substrate, according to the invention.

FIG. 4 is a plan view illustrating another exemplary embodiment of a display substrate, according to the invention.

A display substrate 200 according to the illustrated exemplary embodiment is substantially the same as the display substrate 100 according to the exemplary embodiment described referring to FIGS. 1 and 2, except that a second semiconductor pattern 134 of an oxide semiconductor pattern 136 is insulated by an insulating pattern 138, so the same reference numerals will be used to refer to the same or like parts as those described in the exemplary embodiment of FIGS. 1 and 2, and thus any repetitive explanation concerning the above elements will be omitted or briefly described.

Referring FIG. 4, a display substrate 200 according to the illustrated exemplary embodiment includes a base substrate 101, a gate line GL, a data line DL, a gate insulating layer 120, a thin-film transistor TR, the insulation pattern 138, a passivation layer 150, an organic layer 160 and a pixel electrode 170.

The thin-film transistor TR includes a gate electrode 110, the oxide semiconductor pattern 136, a source electrode 142 and a drain electrode 144. The oxide semiconductor pattern 136 includes a first semiconductor pattern 132 and the second semiconductor pattern 134. The second semiconductor pattern 134 includes a first pattern 134a and a second pattern 134b.

The insulating pattern 138 is disposed between the first and second patterns 134a and 134b of the second semiconductor pattern 134. The insulating pattern 138 electrically insulates the first pattern 134a and the second pattern 134b from each other.

In addition, an exemplary embodiment of a method for manufacturing the display substrate 200 according to the illustrated exemplary embodiment is substantially the same as the method of manufacturing the display substrate 100 according to the exemplary embodiment in FIGS. 3A to 3F, except that the insulating pattern 138 is formed in a channel portion of the thin-film transistor TR instead of removing a portion of the second semiconductor pattern 134, so the same reference numerals will be used to refer to the same or like parts as those described in the exemplary embodiment of FIGS. 3A to 3F, and thus any repetitive explanation concerning the above elements will be omitted or briefly described.

Processes for forming the gate electrode 110 of the thin-film transistor TR, the gate insulating layer 120, a preliminary semiconductor pattern (not shown), a preliminary electrode pattern (not shown) and a remaining pattern (not shown) are substantially the same as those in the method of manufacturing the display substrate 100 according to the exemplary embodiment described referring to FIGS. 3A to 3D, so any repetitive explanation is omitted.

The insulating pattern 138 is formed by insulating the exposed second semiconductor pattern 134 using the source and drain electrodes 142 and 144 as an etch stopping layer. In one exemplary embodiment, for example, the exposed second semiconductor pattern 134 is oxidized using oxygen gas or oxygen gas including boron trichloride ($BCl_3$) to form the insulating pattern 138. Accordingly, the first and second patterns 134a and 134b of the second semiconductor pattern 134 are electrically insulated from each other by the insulating pattern 138.

Processes for forming the passivation layer 150, the organic layer 160 and the pixel electrode 170 on the base substrate 101 on which the insulating pattern 138 is formed, are substantially the same as those in the method of manufacturing the display substrate 100 according to the exemplary embodiment described referring to FIG. 3G, so any repetitive explanation is omitted.

According to the illustrated exemplary embodiment, the oxide semiconductor pattern 136 is a double layer structure to reduce or effectively prevent an ion included in the oxide semiconductor pattern 136 from being deoxidized and extracted.

According to the exemplary embodiments of the invention, an oxide semiconductor pattern is a double layer structure to prevent a metal included in source and drain electrodes from reacting with an oxide semiconductor, and being oxidized. In addition, an ion included in an oxide semiconductor is prevented from being deoxidized and being extracted.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims.

In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display substrate comprising:
   a gate line extending in a first direction on a base substrate;
   a data line extending in a second direction crossing the first direction;
   a thin-film transistor connected to the gate line and the data line respectively, and comprising:
      a gate electrode electrically connected to the gate line;
      a gate insulating layer covering the gate electrode;
      an oxide semiconductor pattern disposed on the gate insulating layer, and overlapping the gate electrode, the oxide semiconductor pattern including a first oxide semiconductor pattern including indium, and a second oxide semiconductor free of indium; and a source electrode and a drain electrode on the oxide semiconductor pattern and spaced apart from each other, wherein the second oxide semiconductor pattern is between the first oxide semiconductor pattern and the source electrode, and between the first oxide semiconductor pattern and the drain electrode; and a pixel electrode electrically connected to the drain electrode.

2. The display substrate of claim 1, wherein the second oxide semiconductor pattern includes at least one of zinc, tin and gallium.

3. The display substrate of claim 2, wherein the second oxide semiconductor pattern includes zinc and at least one selected from the group consisting of boron (B), aluminum (Al), thallium (Tl), tin (Sn), hafnium (Hf), fluorine (F), chlorine (Cl), bromine (Br), iodine (I), astatine (At) and a combination thereof.

4. The display substrate of claim 2, wherein the second oxide semiconductor pattern includes tin and at least one selected from the group consisting of antimony (Sb), fluorine (F) and a combination thereof.

5. The display substrate of claim 2, wherein the second oxide semiconductor pattern includes gallium zinc oxide.

6. The display substrate of claim 2, wherein a carrier concentration of the indium-free oxide of the second semiconductor pattern is between about $10^{17}/cm^3$ and about $10^{21}/cm^3$.

7. The display substrate of claim 1, wherein the gate insulating layer comprises:

a first insulating layer on the base substrate and the gate electrode, and including silicon nitride; and a second insulating layer on the first insulating layer, and including silicon oxide.

8. The display substrate of claim 1, wherein the source electrode and the drain electrode includes copper (Cu).

9. The display substrate of claim 8, wherein the source electrode and the drain electrode includes:

a first metal layer including titanium (Ti), a second metal layer including copper (Cu), and on the first metal layer, and a third metal layer including copper (Cu)-manganese (Mn) alloy or copper (Cu)-manganese (Mn)-Aluminum (Al) alloy on the second metal layer.

10. The display substrate of claim 1, wherein the second oxide semiconductor pattern includes a first pattern, and a second pattern spaced apart from the first pattern, and further comprising an insulating pattern between the first and second patterns of the second oxide semiconductor pattern, and electrically insulating the first and second patterns from each other.

11. The display substrate of claim 1, further comprising a passivation layer including silicon oxide, and on the base substrate, the source electrode and the drain electrode.

* * * * *